US010057103B2

United States Patent
Sen et al.

(10) Patent No.: US 10,057,103 B2
(45) Date of Patent: Aug. 21, 2018

(54) ALL DIGITAL MULTI-CHANNEL RF TRANSMITTER FOR PARALEL MAGNETIC RESONANCE IMAGING WITH SSB MODULATION

(71) Applicant: Aselsan Elektronik Sanayi ve Ticaret Anonim Sirketi, Ankara (TR)

(72) Inventors: Bulent Sen, Ankara (TR); Filiz Ece Sagcan, Ankara (TR); Aylin Bayram, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 0 days.

(21) Appl. No.: 15/504,096

(22) PCT Filed: Jan. 28, 2016

(86) PCT No.: PCT/TR2016/050021
§ 371 (c)(1),
(2) Date: Feb. 15, 2017

(87) PCT Pub. No.: WO2017/131594
PCT Pub. Date: Aug. 3, 2017

(65) Prior Publication Data
US 2018/0109411 A1 Apr. 19, 2018

(51) Int. Cl.
*H03M 3/00* (2006.01)
*H04L 27/36* (2006.01)
(Continued)

(52) U.S. Cl.
CPC ............ *H04L 27/362* (2013.01); *H03C 3/40* (2013.01); *H03D 3/007* (2013.01); *H03M 3/40* (2013.01);
(Continued)

(58) Field of Classification Search
CPC .... H03M 3/40; H04L 27/362; H04L 27/2332; H03C 3/40; H03D 3/007
(Continued)

(56) References Cited

U.S. PATENT DOCUMENTS 6,094,458 A * 7/2000 Hellberg ................... H03F 3/24
341/143
6,339,621 B1 * 1/2002 Cojocaru .............. H04L 27/362
375/247

(Continued)

OTHER PUBLICATIONS

Sagcan Filiz Ece et al: "FPGA implementation of Delta Sigma Modulation based all-digital RF transmitter for parallel magnetic resonance imaging", 2015 European Microwave Conference (EUMC), EUMA, Sep. 7, 2015, pp. 494-497, XP032822909, DOI: 10.1109/EUMC. 2015. 7345808 [retrieved on Dec. 2, 2015] Section "I. Introduction"Section " II. All Digital Modulator" figures 1-3, 6.
(Continued)

*Primary Examiner* — Lam T Mai
(74) *Attorney, Agent, or Firm* — Gokalp Bayramoglu

(57) ABSTRACT

In the present invention, an all digital, multi channel RF transmitter is utilized for a parallel magnetic resonance imaging (MRI) device, MRI signal generation, modulation and amplification are employed entirely digitally in the proposed RF transmitter, which enables each transmit channel to be easily and individually reconfigured in both amplitude and phase. Individual channel control ensures a homogeneous magnetic field in the multi channel RF coil in MRI. Besides the homogeneous magnetic field generation, multi-frequency MRI signal generation is made easy by the present invention with very high frequency resolution. Multi-frequency enables faster image acquisition which reduces MRI operation time. Digital Weaver Single Side Band (SSB) modulation is also incorporated into the all digital transmitter to suppress unwanted bands of Double
(Continued)

Side Band (DSB) MRI signals. The power amplifier in the MRI transmitter does not amplify the unwanted band so that SSB modulation leads to higher power efficiency.

4 Claims, 14 Drawing Sheets

(51) Int. Cl.
 *H03C 3/40* (2006.01)
 *H04L 27/233* (2006.01)
 *H03D 3/00* (2006.01)

(52) U.S. Cl.
 CPC .... *H04L 27/2332* (2013.01); *H03F 2200/331* (2013.01)

(58) Field of Classification Search
 USPC ......................................................... 341/143
 See application file for complete search history.

(56) References Cited

U.S. PATENT DOCUMENTS

| | | | |
|---|---|---|---|
| 6,445,736 B1* | 9/2002 | Wheeler | H04L 25/062 375/235 |
| 7,272,164 B2* | 9/2007 | Sorrells | H03C 3/40 375/147 |
| 9,438,266 B1* | 9/2016 | Nagaraj | H03M 3/38 |
| 2005/0083220 A1* | 4/2005 | Siferd | H03M 3/344 341/143 |
| 2006/0129256 A1* | 6/2006 | Melanson | H03H 17/04 700/94 |

OTHER PUBLICATIONS

Silva Nelson V et al: "Novel fine tunable multichannel all-digital transmitter", IEEE-MTTS International Microwave Symposium. Digest, IEEE, US, Jun. 2, 2013, pp. 1-3, XP032546093, ISSN: 0149-645X, DOI: 10.1109/MWSYM. 2013. 6697531 [retrieved on Dec. 27, 2013] the whole document.

* cited by examiner

ALL DIGITAL MULTI-CHANNEL RF TRANSMITTER FOR PARALEL MAGNETIC RESONANCE IMAGING WITH SSB MODULATION

CROSS REFERENCE TO RELATED APPLICATIONS

This application is the national phase of International Application No. PCT/TR2016/050021, filed on Jan. 28, 2016. the entire contents of which are incorporated herein by reference.

FIELD OF THE INVENTION

The present disclosure is related with all-digital multi-channel RF transmitter architecture for "Medical Imaging Devices". Via all-digital RF transmitter architecture, signal modulation and amplification are employed all digitally up to the transmitter's antenna, which enables reconfiguring each transmit channel individually. Individual control of each transmit channel is a critical feature for the multi-channel MRI transmitter approach allowing removal of inhomogenities in the magnetic field (RF Shimming) and applying special algorithms for Synthetic. Absorption Rate (SAR) reduction on the target.

Since all-digital RE transmitter architecture can employ switch mode RF power amplifiers, the architecture ensures high efficiency out of the transmitter. Additionally, multi-band Magnetic Resonance Imaging (MRI) signals, which include as many spectral components as required, can also be generated with very narrow frequency spacing in the order of sub-Hz.

BACKGROUND OF THE INVENTION

Magnetic resonance imaging (MRI) device is a test that uses a magnetic field and pulses of radio wave energy to make images of organs and structures inside a body. Conventional MRI devices involve RF transmitters which are all operated on the basis of amplification of an analog input signal with only one high power RF power amplifier. A conventional MRI transmitter is illustrated in FIG. 1. However, studies are progressing to make multi-channel transmitters with lower power RF amplifiers for each channel and to take advantage of all-digital transmitter architectures. In this regard, new MRI transmitters are envisaged to include all-digital structures with multi-channel capabilities, RF low power amplifiers, and optical signal transmission. A new generation multi-channel MRI transmitter block diagram is illustrated in FIG. 2.

Via new generation multi-channel MRI transmitter with digital modulation method, each transmitter channel can be reconfigured individually. Many parameters like signal type, frequency of operation, phase and amplitude information for RF shimming can be changed easily from a control computer. High image quality with RF shimming capability is expected to be achieved with new generation multi-channel transmitter.

In brief, a direct all-digital transmitter uses a modulation technique to digitize and modulate analog signals. With modulation, the analog input signal is converted into a digital signal where the analog information is encoded into pulse width of digital pulses, which is referred to as pulse width modulation. After amplification of the digital pulses, digitally modulated pulses are then passed through a band pass filter to recover the analog information.

One of the critical components in the multi channel direct all-digital transmitter system is the modulator in which an up conversion to radio frequency is carried out. Delta Sigma Modulation (DSM) based IQ modulators are the most widely used components inside a direct all-digital MRI transmitter. DSM based digital IQ modulator architecture in literature is shown in FIG. 3. In a digital IQ modulator, an input signal is digitized and then decomposed into inphase and quadrature components. Next, these two signals are converted into 1-bit digital data with. Delta Sigma Modulator (DSM). DSM signals are multiplied by clock signals whose phase difference is 90° with xnor operation. Then I and Q arms are added in MUX. The clock frequency, fclock should be chosen at the desired MRI carrier frequency and the sampling frequency should be 4×fclock due to xnor and MU X operation. When the digital output signal is filtered with a bandpass filter at the clock frequency, modulated analog signal is recovered.

One drawback of the conventional DSM based IQ modulator is performing lower signal to noise ratio. The reason behind this is the possibility of feeding different amplitude levels in each DSM block at the I and Q arms of the modulator.

The present invention resolves this problem by using an IQ pre-modulation as shown in FIG. 5. Hence, the new amplitude levels at each DSM input are identical and the modulator performs better in SNR (Signal-to-Noise Ratio).

In the conventional digital IQ modulator shown in FIG. 3, only one MRI carrier frequency is generated. In MRI systems, multi-band MRI signal generation at fclock±deltaf (deltaf is order of Hz) is a critical process for reducing scan time. There are mixed-mode clock manager (MMCM) blocks in Field Programmable Gate Array (FPGA) to be used for clock generation. However with these blocks, clock generation with high frequency resolution (narrow frequency spacing in Hz), cannot be achieved due to the limited frequency generation capacity of digital phase-locked loop (PLL) structure inside the MMCM blocks.

Other technique shown in FIG. 1 to achieve multi-band frequency generation with high frequency resolution is direct digital synthesizer (DDS) modules. However, the output of a DDS module is analog which dictates digital to analog converter. Since, an analog MRI signal cannot be amplified with a highly efficient RF power amplifier (switch mode power amplifiers), system efficiency is limited for DDS module structures and an all-digital concept is violated.

Another technique conventional IQ modulator shown in FIG. 3 can be used to achieve multi-band frequency generation with high frequency resolution capabilities can be done at digital baseband. However, double side band modulation occurs as a result of IQ modulation. In FIG. 4, double side band modulation is seen at the output of the conventional IQ modulator. The unwanted band cannot be filtered before power amplification, because filtering operations convert the digital signal to an analog signal. Thus, highly efficient digital power amplification cannot be achieved and an all-digital transmitter concept is violated. Although the unwanted band can be filtered out at the power amplifier output with a high Q RF coil (see FIG. 3), power amplifier efficiency is reduced in half, since the unwanted hand of the double sideband is also redundantly amplified through the RF power amplifier.

SUMMARY OF THE INVENTION

The object of the invention is to achieve Delta Sigma Modulation (DSM) based all-digital RF transmitter architecture for MRI with single side band capability which enhances overall transmitter efficiency due to the elimination of excessive power from the double sideband.

Another object of the invention is to be able to generate multi-band MRI signals which involves as many spectral components as required with very narrow frequency spacing for MRI operations.

Another objective of the invention is to improve DSM based IQ modulator performance SNR by using IQ pre-modulation circuit before Delta Sigma modulation. With this approach, the signals that go into the DSM blocks at each arm of the IQ modulator have identical peak amplitude levels. Peak amplitude levels enables identical amplitude coefficients inside the DSM block which gives better SNR performance at the modulator output.

BRIEF DESCRIPTION OF THE DRAWINGS

An exemplary embodiment of the present invention is illustrated b way of example in the accompanying drawings to be more easily understood and uses thereof will be more readily apparent when considered in view of the detailed description, in which like reference numbers indicate the same or similar elements, and the following figures in which.

DETAILED DESCRIPTION OF THE INVENTION

Figure 1:
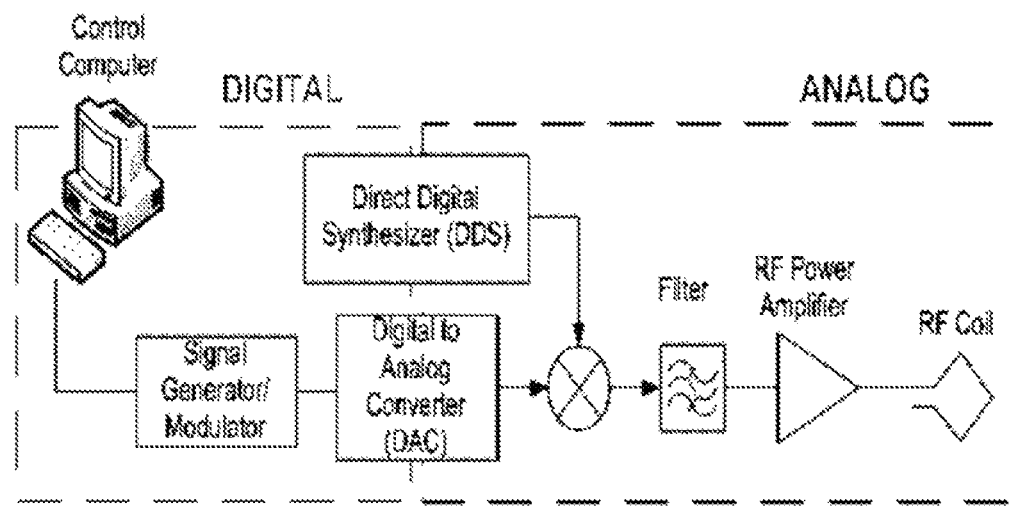
FIG. 1. Basic block diagram of a conventional MRI transmitter.
Figure 2:
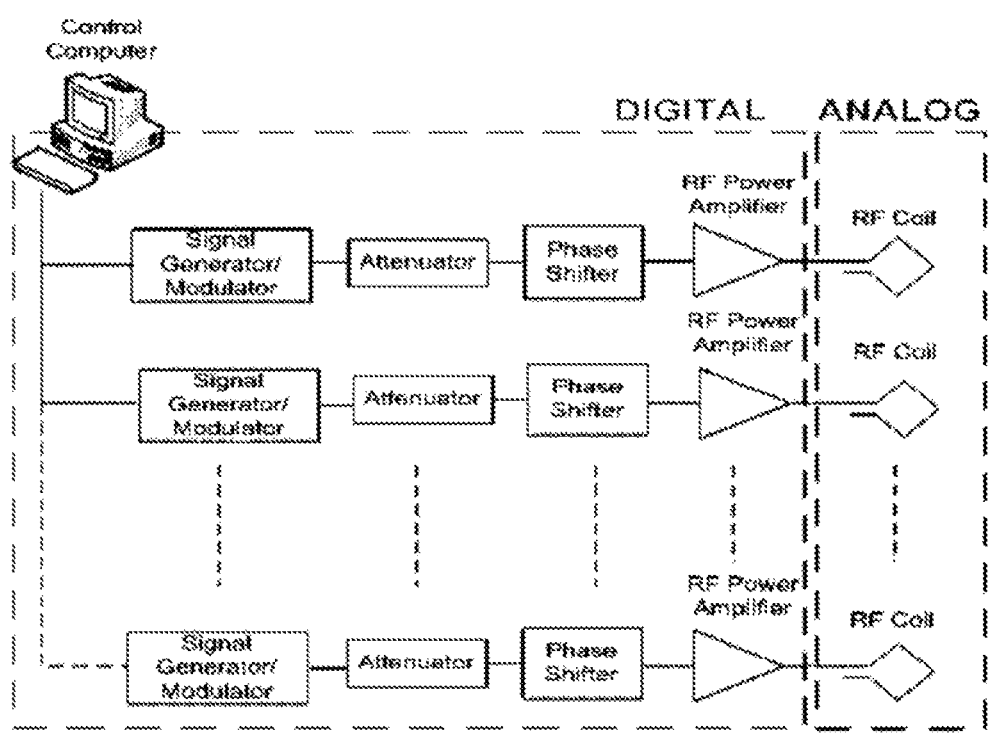
FIG. 2. A basic block diagram of a multi-channel, all-digital transmitter architecture for MRI.
Figure 3:
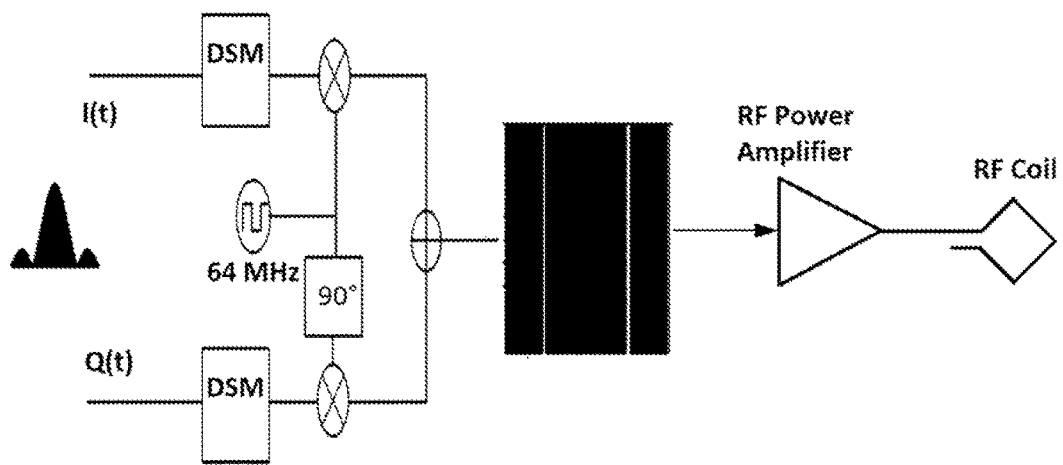
FIG. 3. Block diagram of conventional direct all-digital transmitter with DSM based IQ modulator.
Figure 4:
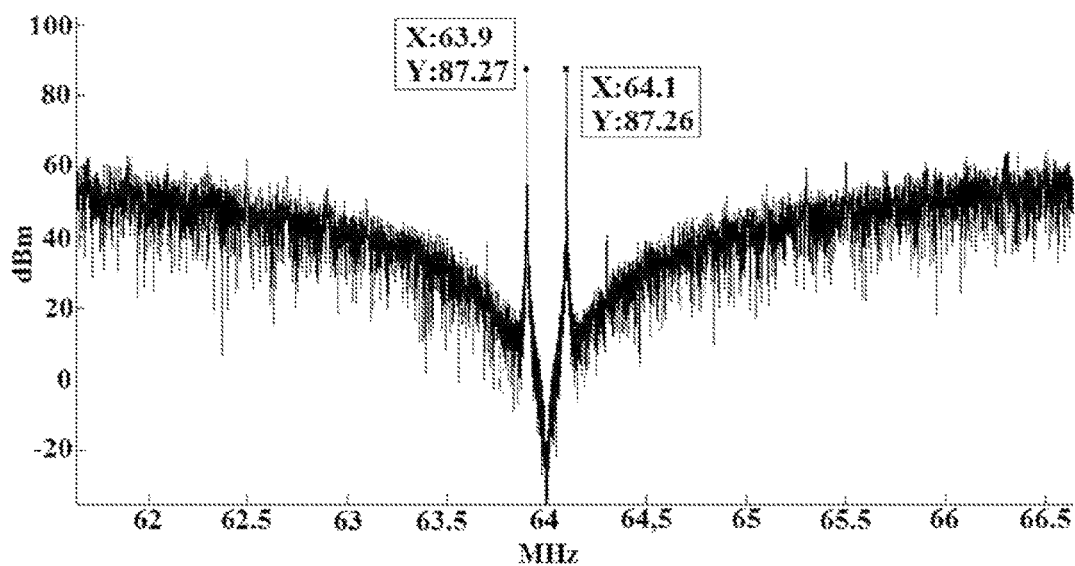
FIG. 4. Frequency spectrum of DSM based IQ modulator output.

The present invention relates to an all-digital RF transmitter, where signal modulations and amplifications are employed all digitally up to the transmitter's antenna, for Medical Imaging Devices comprising an analog to digital converter blog converting an analog input signal into a digital MRI signal by using Delta Sigma Modulation (DSM);

a DSM based Weaver SSB Modulator multiplying the digital MRI signal with at least one sine signal $f_{1n}$ where $f_2-f_{1n}$=deltaf$_n$ and deltaf$_n$ is the frequency difference between the desired MRI carrier frequency and the MRI frequency, $f_2$ is an arbitrary constant, splitting the multiplied digital MRI signal into two signals, multiplying the two signals with in-phase and quadrature sine signals $f_2$ and multiplying with a 90° phase difference, filtering the two signals by a low pass FIR filter to remove the upper frequency of the two equal power signals, modulating the low pass FIR filter outputs by a DSM functional block, passing DSM functional block outputs through a xnor operation with in-phase and quadrature clock at the MRI frequency, summing up xnor operation outputs by a MUX block in order to remove a lower side band signal and create a single side band modulated digital MRI signal, where the analog to digital converter blog is an I/Q modulator blog.

The present invention relates to an all-digital RF transmitter method, where signal modulations and amplifications are employed all digitally up to the transmitter's antenna, for Medical Imaging Devices comprising the steps of converting an analog input signal into a digital MRI signal by using Delta Sigma Modulation;

decomposing I and Q components of the analog signal to convert the analog input signal into a digital MRI signal;

multiplying the digital MRI signal with at least one sine signal $f_{1n}$ where $f_2-f_{1n}$=deltaf$_n$ and deltaf$_n$ is the frequency difference between the desired MRI carrier frequency and the MRI frequency, $f_2$ is an arbitrary constant;

splitting the multiplied digital MRI signal into two signals;

multiplying the two signals with in-phase and quadrature sine signals at $f_2$ and multiplying with 90° phase difference, filtering the two signals by a low pass FIR filter to remove the upper frequency of the two signals, modulating the low pass FIR filter outputs by a DSM functional block, passing DSM functional block outputs through a xnor operation with in-phase and quadrature clock at the MRI frequency, summing up xnor operation outputs by a MUX block in order to remove a lower side band signal and create a single side band modulated digital MRI signal.

In the present invention, an all digital, multi channel RF transmitter is introduced for parallel magnetic resonance imaging (MRI) device, MRI signal generation, modulation and amplification are employed entirely digitally in the proposed RF transmitter, which enables reconfiguring of each transmit channel individually. Individual channel control ensures homogeneous magnetic field in the multi channel RF coil in MRI. Digital signal modulation is utilized to transmit digital MRI signal to the RF coil with an optical transmission line. This avoids signal degradation due to RF interference. Besides the digital transmission over optical line, multi-frequency MRI signal generation is made easy by the present invention with very high frequency resolution on the order of sub-Hz. Multi frequency enables faster image acquisition which reduces total MRI operation time, Digital Weaver Single Side Band (SSB) modulation is also incorporated into the all digital transmitter architecture to suppress unwanted bands of Double Side Band (DSB) MRI signal, which is generated due to the nature of the modulation. The power amplifier in the MRI transmitter does not amplify the unwanted band so that SSB modulation leads to higher power efficiency. The blocks (see FIG. 5) of the architecture are explained in the following sections.

Analog Input Signal

Analog input signals used in MRI system are usually narrowband complex signals whose pulse length is typically on the order of msec. MRI devices prevalently use sine (see FIG. 7) and gauss signals for operation. However, other types of signals can also be generated as an MRI signal on demand. In the present invention, MRI transmitter system, any analog MRI complex signal which occupies frequency band of around 1 MHz can be modulated with DSM. The restriction of 1 MHz is originated from MRI coil, which has around 1 MHz frequency bandwidth. MRI frequency is determined by the magnetic field strength of the MRI magnet with the equation $f_{mri}=\Upsilon B_0$ ($\Upsilon$ is Larmor frequency and its value is 42.58 MHz/T). The MRI frequency is 64 MHz in the preferred embodiment of the invention. In the present invention, the MRI signal frequency is adjustable within the operational frequency band with high precision.

MultiBand Signal Generation Block in Baseband (CORDIC Block)

Figure 9:
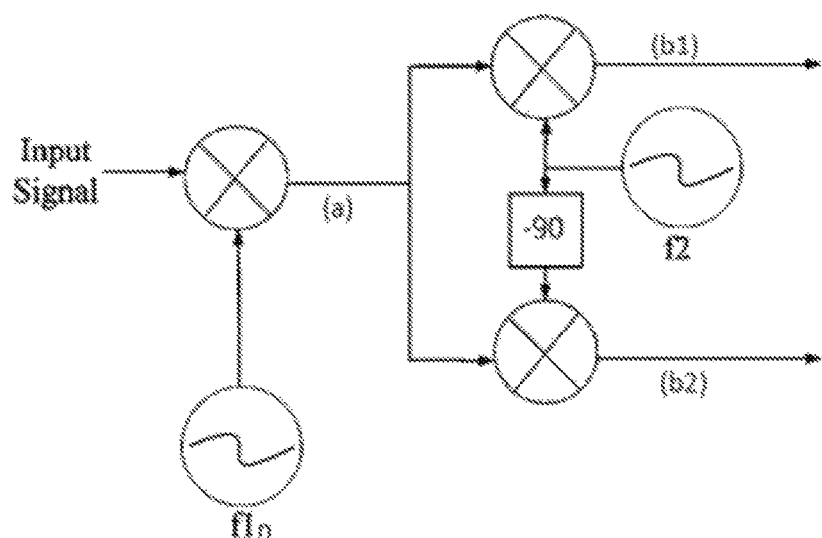
FIG. 9. Block diagram of multi-band MRI carrier frequency generation block in baseband (Cordic Block).
Figure 10:
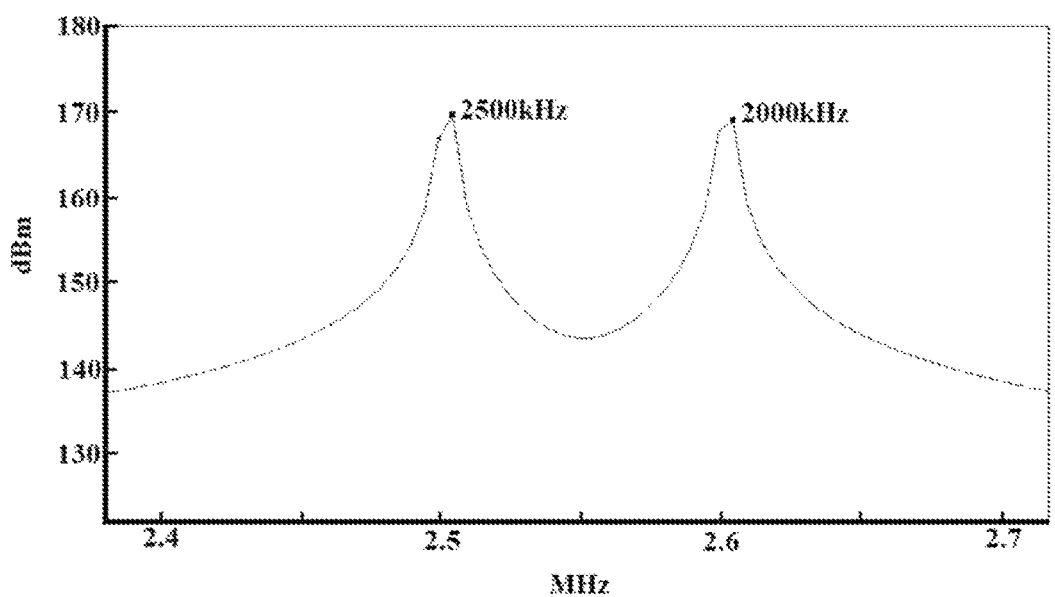
FIG. 10. Addition of two frequency components.

COordinate Rotation DIgital Computer (CORDIC) algorithm is used in a FPGA for signal synthesization in order to meet multi-band signal generation and small inter-carrier frequency spacing requirements, CORDIC IP core has a 32-bit phase input, thus it is sufficient to achieve even 1 Hz inter-carrier frequency spacing. In Multiband Signal Generation Block, the analog input signal mentioned above is multiplied with a sine signal at a frequency of $f_{1n}$ such that $f_{1n}=\sin(2\pi f_{11}t)+\sin(2\pi f_{12}t)+\sin(2\pi f_{13}t)+ \ldots +\sin(2\pi f_{1n}t)$ according to the number of desired MRI carrier frequency (MRI signal frequency) as shown in FIG. 9. The number of frequency components in the multiband signal can be easily set in CORDIC. In the present invention, f2 is kept constant and its value is 2750 kHz. f1n is changed such that $f_2-f_{1n}=deltaf_n$. As an example, if the desired MRI carrier frequency is chosen to be 64.25 MHz, $f_{1n}$ contains single frequency component as $f_{11}$ and deltaf should be 250 kHz. If for instance, the multiband signal generation is required to include the components at 64.15 and 64.25 MHz, $f_{1n}$ consists of two sine signals at $f_{11}$, $f_{12}$ should be synthesized such that $deltaf_1=f_2-f_{11}=150$ kHz, and $deltaf_2=f_2-f_{12}=250$ kHz. Therefore, $f_{11}$ and $f_{12}$ becomes 2600 kHz and 2500 kHz respectively. In this case, the spectrum of frequency modulated input signal at (a) in FIG. 9 with two distinct frequency components ($f_{11}$ and $f_{12}$) is shown in FIG. 10. The number of MRI signal frequency components can be increased on demand.

In the invention, $f_{1n}$ could be directly multiplied with I and Q signal without using the second multiplication stage with $f_2$. However, higher $deltaf_n$ resolution can be achieved with two multiplication stage in a way that $f_{1n}$ ad $f_2$ should be chosen to take apart the sum $(f_{1n}+f_2)$ and difference $(f_2-f_{1n})$ components in spectrum to facilitate post filtering.

Delta Sigma Modulator

The Delta Sigma Modulator (DSM) is utilized to convert the analog input signal to digital with only 1-bit resolution. In this way, a switch mode RF power amplifier, which may come after the modulator, can amplify the digital signal with high efficiency. The envelope information in the analog input signal is encoded with pulse width modulator in the DSM block. The output of the DSM is a 1-bit digital signal. Another benefit taken from the DSM is the ability to move the inband noise out of band, which is called noise shaping. The amount of noise shaping is related with the order of the DSM and a second order DSM is preferred in the proposed all-digital transmitter due to stability. The DSM order and the oversampling ratio are the two most critical parameters to tweak in order to reach the optimum circuit performance. The noise (NTF) and signal (STF) transfer functions are derived as in equations 1 and 2, respectively for a two order DSM topology.

$$NTF = \frac{1-z^{-1}}{(1-z^{-1})+\frac{1}{(1-z^{-1})}+2} \quad (1)$$

$$STF = NTF\left(\frac{z}{z+1}\right)^2 \quad (2)$$

Figure 6:
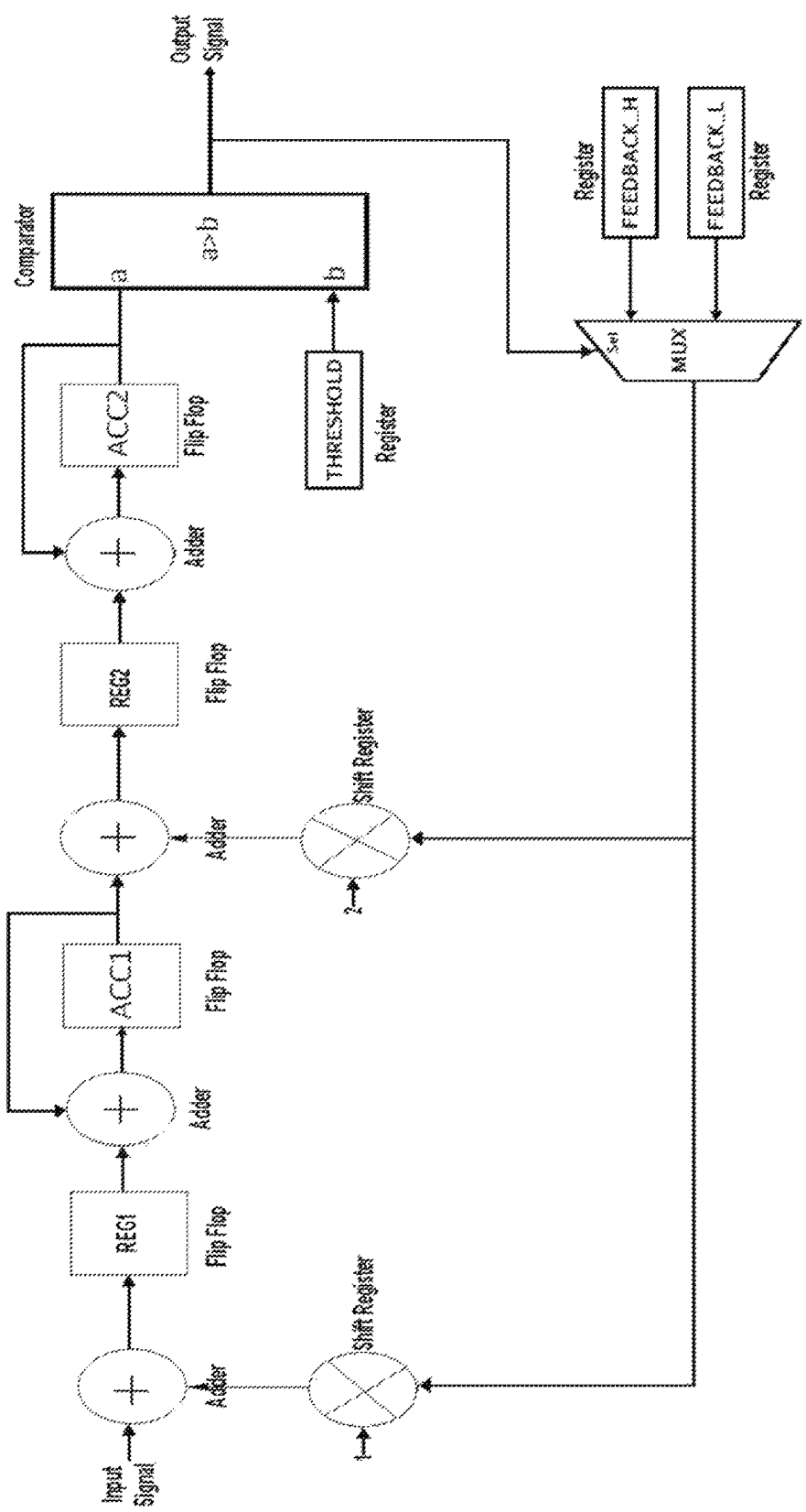
FIG. 6. Block Diagram of Delta Sigma Modulator.
Figure 7:
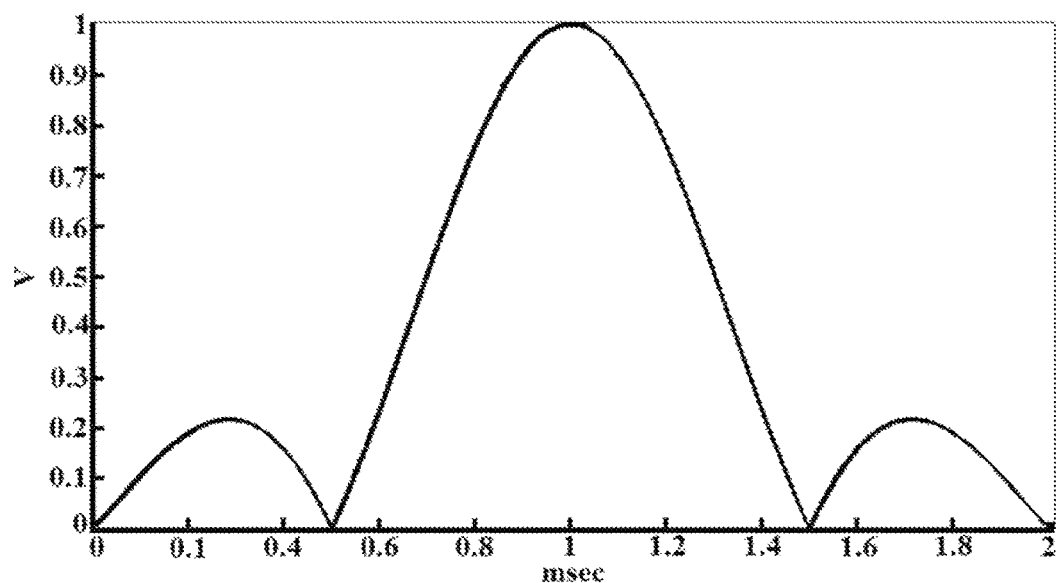
FIG. 7. Input signal to DSM block.
Figure 8:
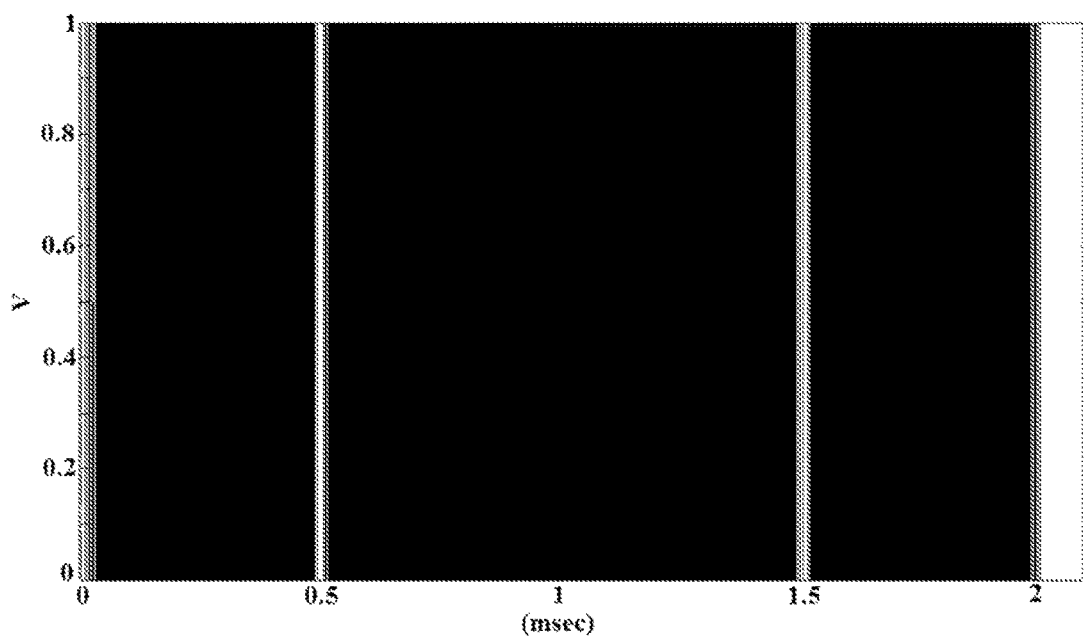
FIG. 8. Output signal of DSM block.

FPGA implementation of the DSM is given in FIG. 6. Input and output signals of the DSM block are shown in FIG. 7 and FIG. 8 respectively.

DSM Based Weaver SSB Modulator Block

Figure 11:
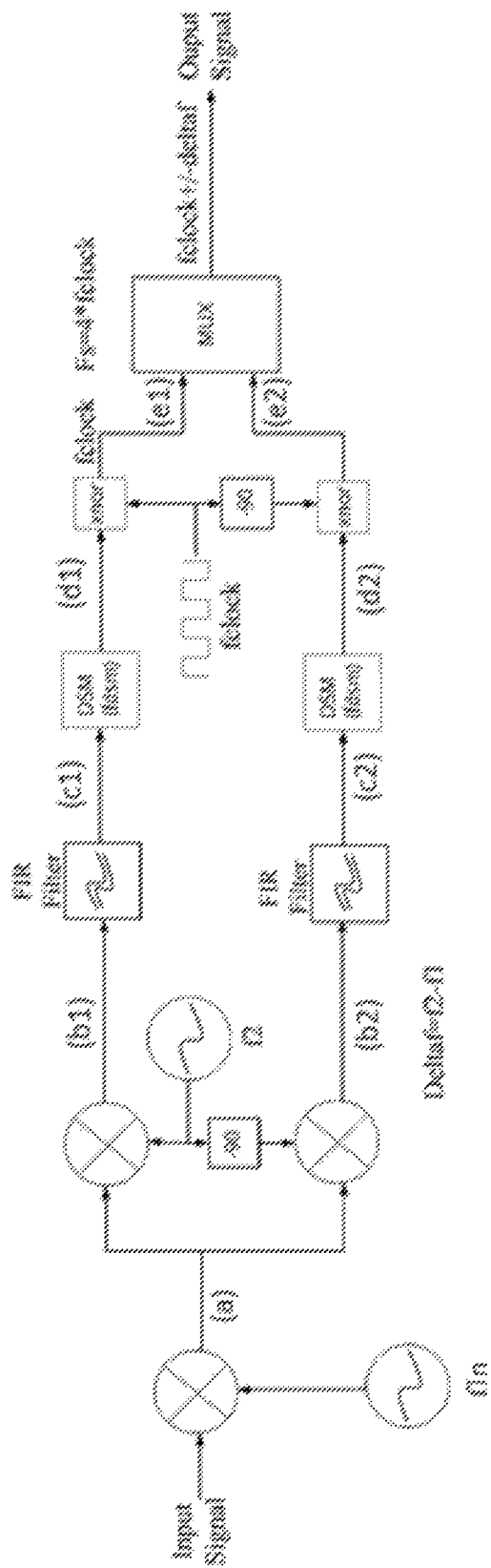
FIG. 11. Block diagram of DSM based weaver SSB modulator.

Block diagram of DSM based Weaver SSB Modulator is shown in FIG. 11. In this modulation, deltaf is the frequency difference between the desired MRI carrier frequency and the MRI frequency. In the preferred embodiment of the invention MRI frequency is 64 MHz.

Figure 12:
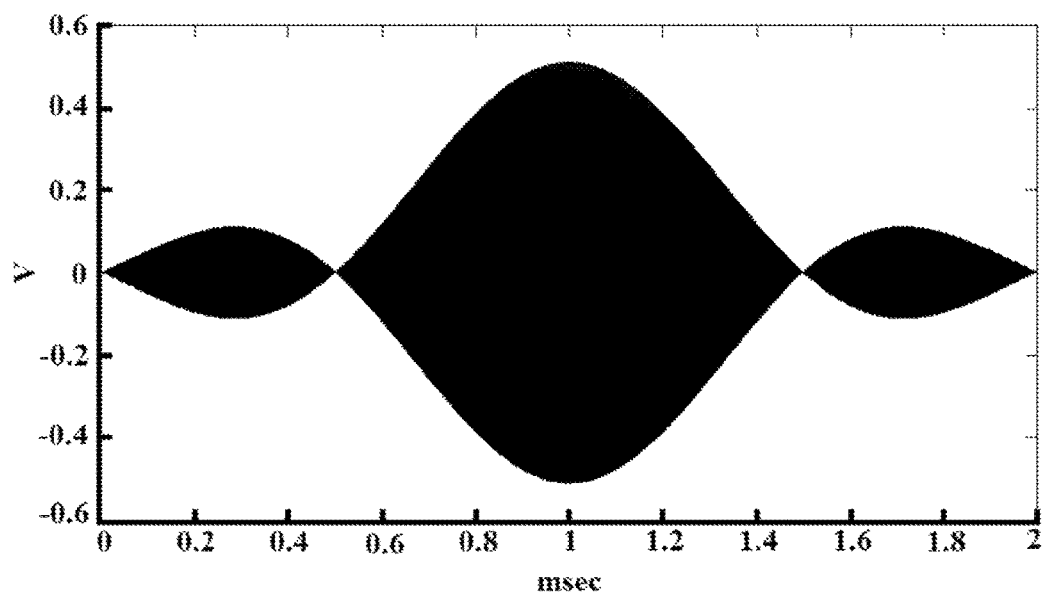
FIG. 12. Amplitude modulated input signal at 2650 kHz.
Figure 13:
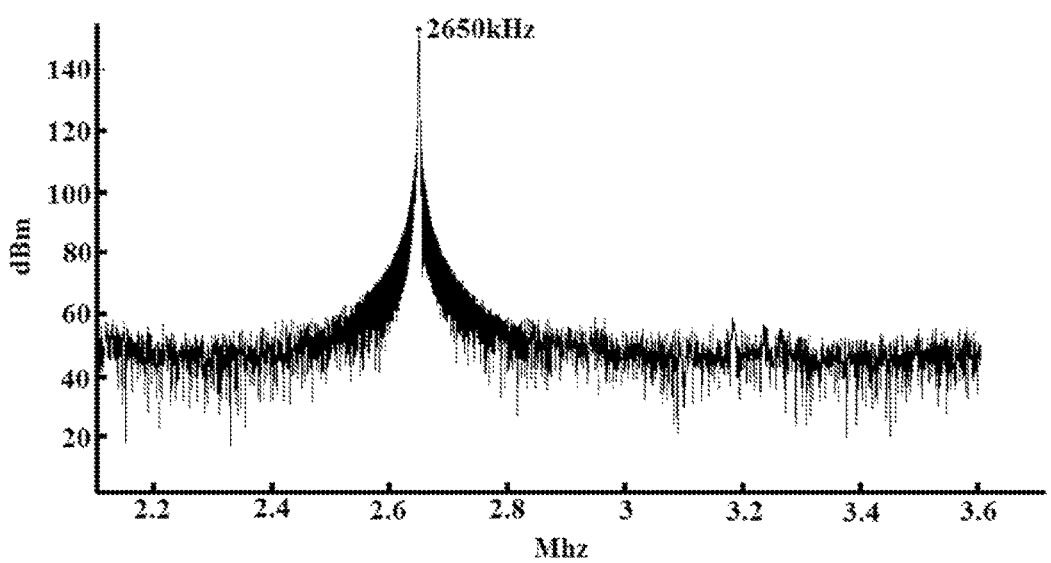
FIG. 13. Spectrum of amplitude modulated input signal at 2650 kHz.
Figure 14:
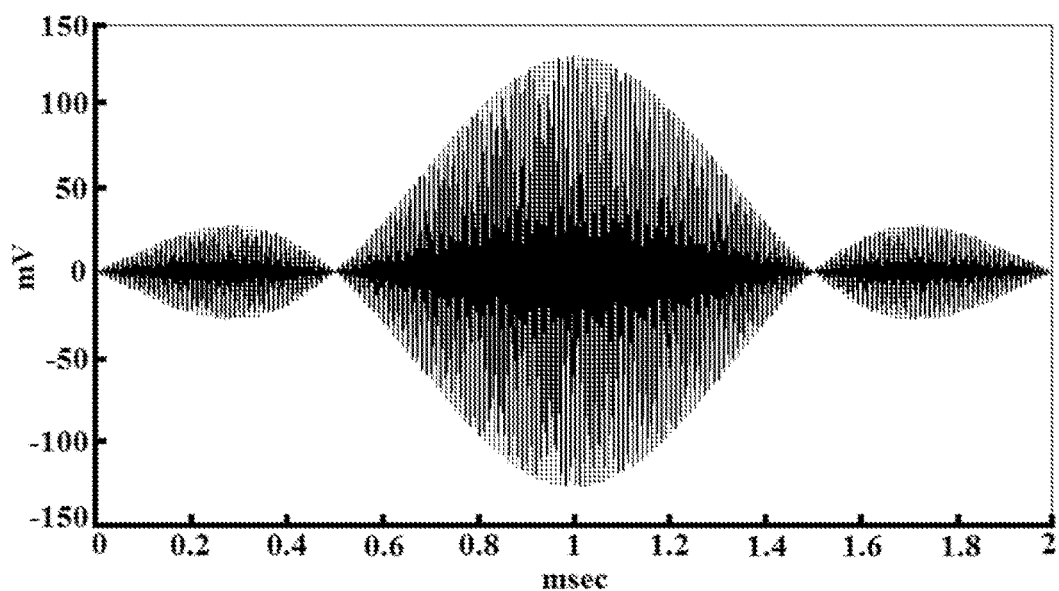
FIG. 14. Amplitude modulated input signal at 2650 and 2750 kHz.
Figure 15:
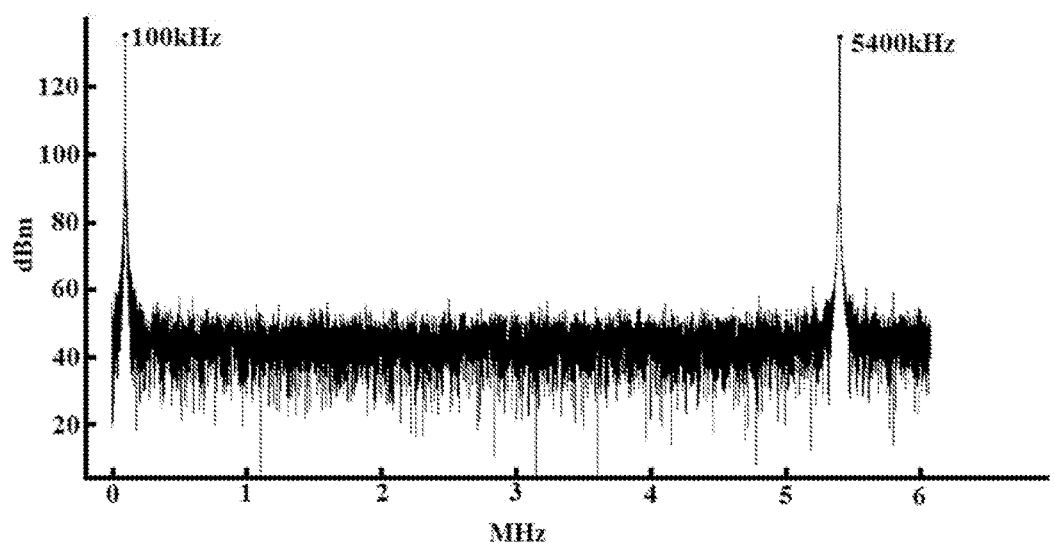
FIG. 15. Spectrum of amplitude modulated input signal at 2650 and 2750 kHz.
Figure 16:
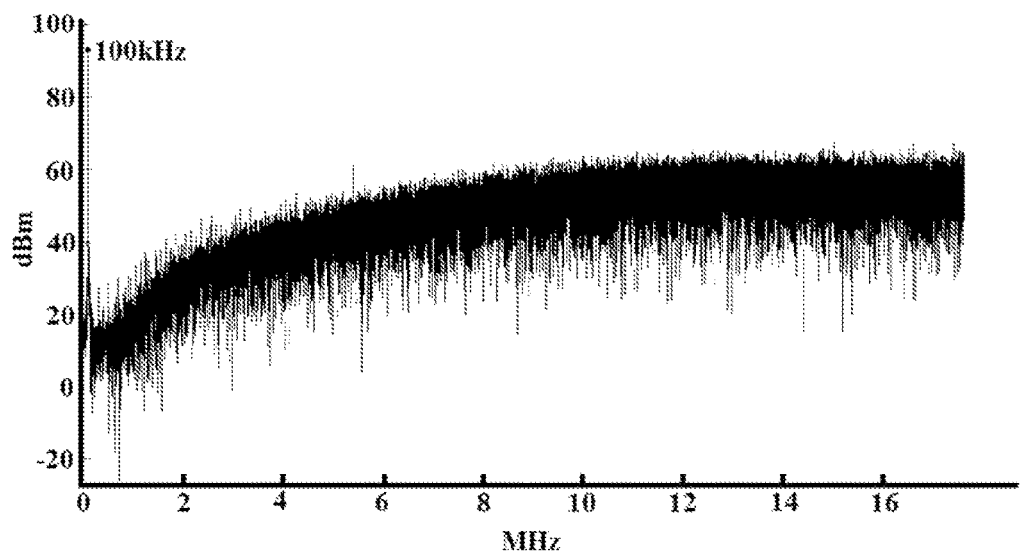
FIG. 16. Spectrum of DSM output.
Figure 17:
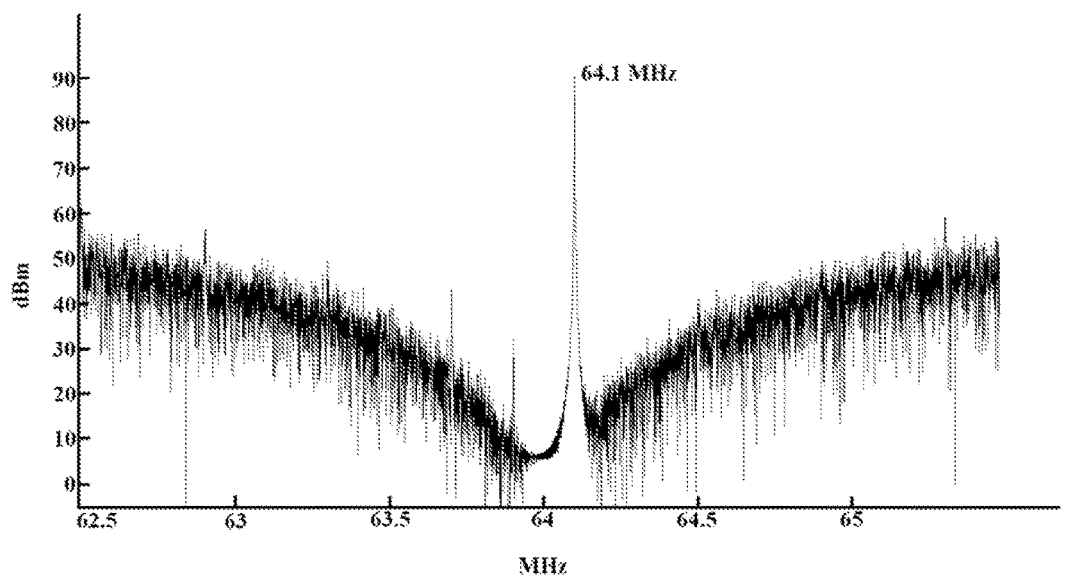
FIG. 17. Spectrum of weaver SSB modulated DSM output at 64.1 MHz.

Analog input signal in baseband (sine signal) is first converted to digital and then multiplied by sine signal at a frequency of $f_{1n}$ ((a) in FIG. 11) as mentioned in previous part. In FIG. 12 and FIG. 13, the time domain signal and frequency spectrum of the signal at (a) in FIG. 11 is shown for $f_{11}=2650$ kHz respectively. Then signal at (a) in FIG. 11 is split into two equal power signals for further frequency modulation. Then two arms are multiplied with in phase and quadrature sine signals at $f_2$ which is constant at 2750 kHz for SSB modulation and two signals at (b1) and (2) are obtained after multiplication with 90° phase difference. In order to easily filter out the sum and difference spectral components after multiplication stage, f2 could be chosen as the maximum frequency that the CORDIC module could generate. The input signal, modulated with $f_{11}=2650$ kHz and $f_2$((b1) in FIG. 11) is shown in FIG. 14. The frequency spectrum of the signal in FIG. 14 is illustrated in FIG. 15. The sum and difference components after multiplication is seen in FIG. 15 at $f_2-f_{11}=100$ Hz and $f_{11}+f_2=5400$ kHz. These two arms ((b1) and (b2) in FIG. 11) are filtered by lowpass FIR filter to remove the upper frequency component. Therefore, the modulated signal at $f_2-f_{11}$ ((c1) and (c2)

in FIG. 11) exists at the input of the DSM functional blocks. The frequency spectrum of DSM output ((d1) and (d2) in FIG. 11) is shown in FIG. 16. Then two DSM outputs are passed through an xnor operation with inphase and quadrature clock (fmri=64 MHz) at the MRI frequency. The two arms ((e1) and (e2) in FIG. 11) are summed up with MUX block afterwards to convert the modulation to a single side band in order to remove the lower side band signal. Output signal in FIG. 11 becomes SSB modulated signal at fclock±deltaf. For $f_{11}$=2650 kHz, output signal is modulated with 64.1 MHz as shown in FIG. 17. The Sampling frequency at multiplexing should be at 4×fclock because 90° phase difference is mandatory in IQ modulators and can be obtained shifting the clock one sample at 4×fclock sampling frequency.

IQ Modulator with DSM Based Weaver SSB Modulation

Figure 5:
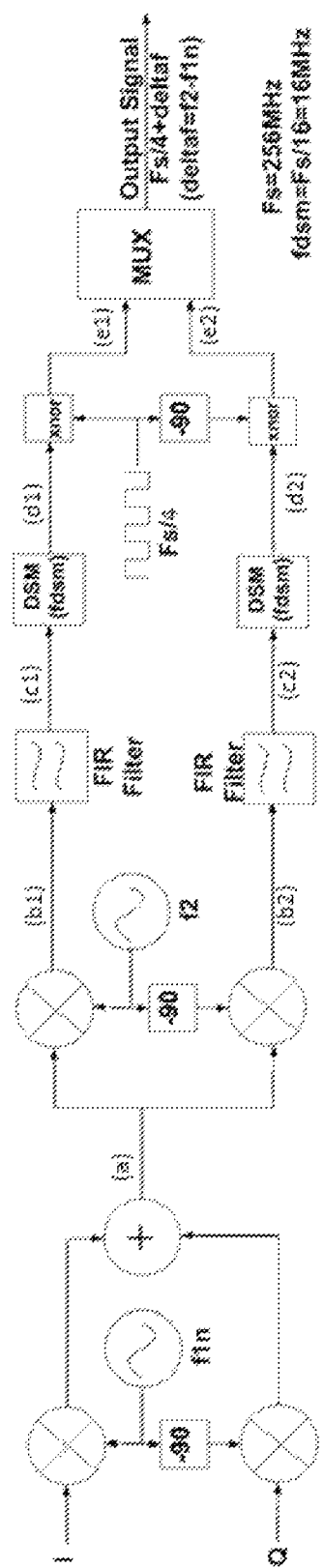
FIG. 5. Block diagram of DSM based all-digital I&Q modulator of the present invention.

Block diagram of an IQ modulator with DSM based Weaver SSB modulation is given in FIG. 5. Since MRI signal is a complex signal, the IQ modulator should be used. Complex baseband analog signal is decomposed to I and Q components. Then, the signal is IQ modulated at f1n ((a) in FIG. 5). The IQ modulated signal is multiplied with inphase and quadrature component of f2. The output at I and Q arms (b1 and b2) are shown in FIG. 5. Next, These two signals are filtered with FIR lowpass filter and are fed into each DSM modules. The output of each DSM block ((d1) and (d2) in FIG. 5) are multiplied with a clock frequency of Fs/4 for IQ modulation and (e1) and (e2) in FIG. 5 are generated. Then these two signals ((e1) and (e2) in FIG. 5) are multiplexed in the MUX block. The modulated MRI signal at the frequency of Fs/4+deltaf is generated at the MUX output with SSB modulation.

Figure 18:
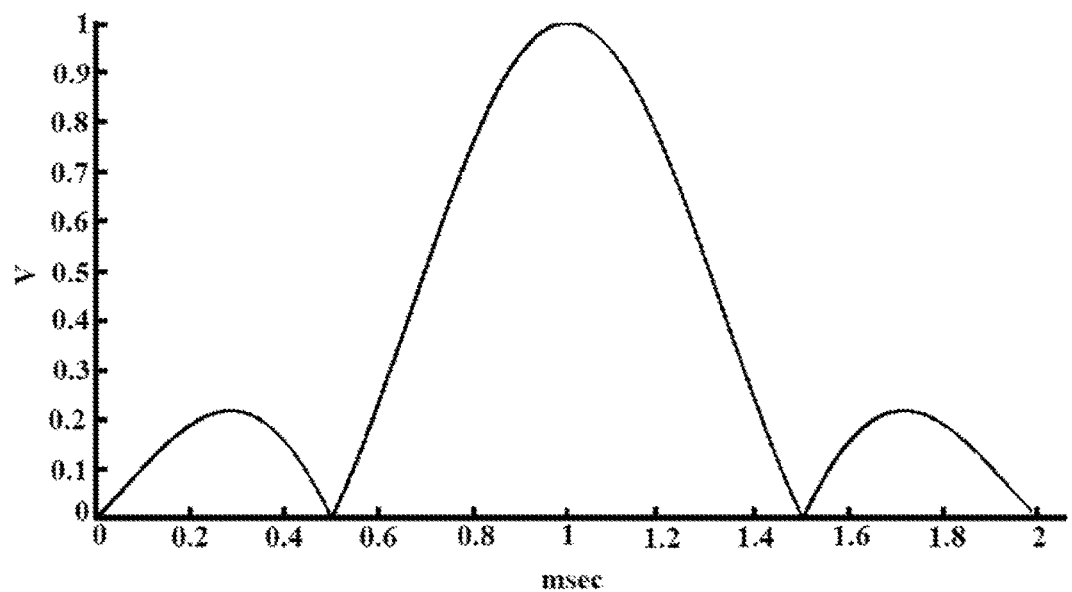
FIG. 18. Amplitude information of input signal.
Figure 19:
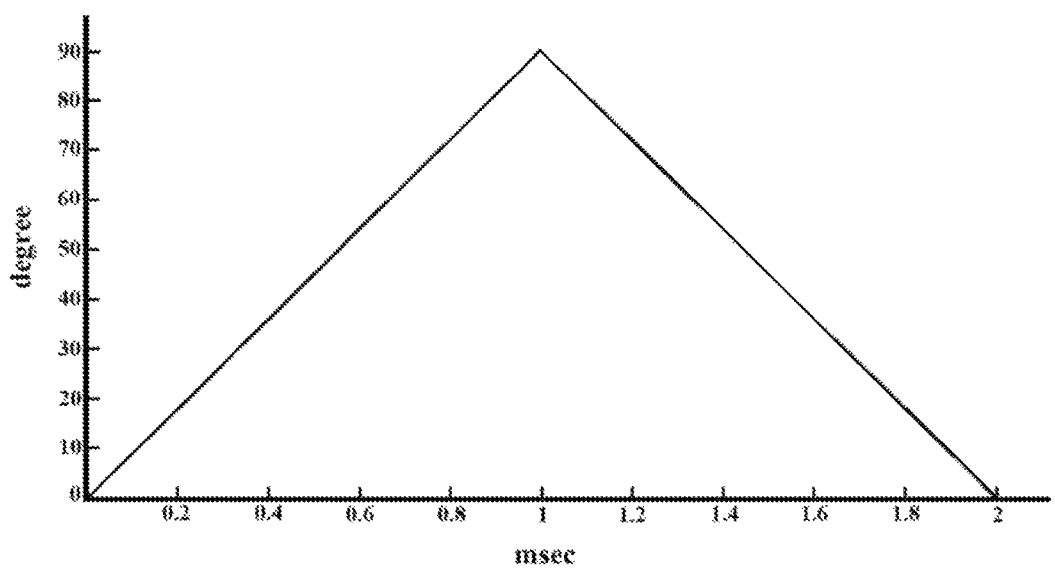
FIG. 19. Phase information of input signal.
Figure 20:
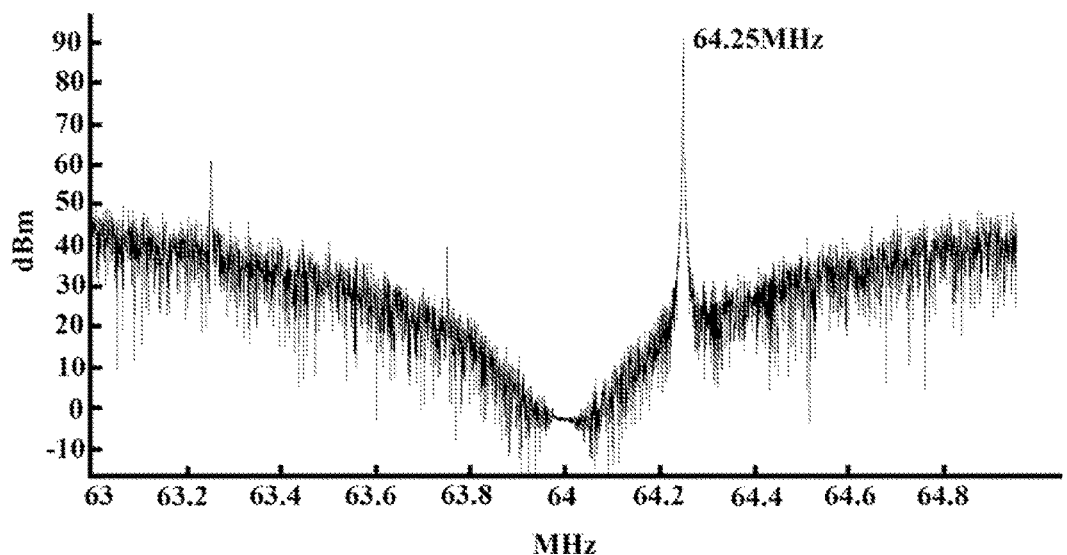
FIG. 20. Output spectrum of IQ modulator with DSM based weaver SSB of the present invention.
Figure 21:
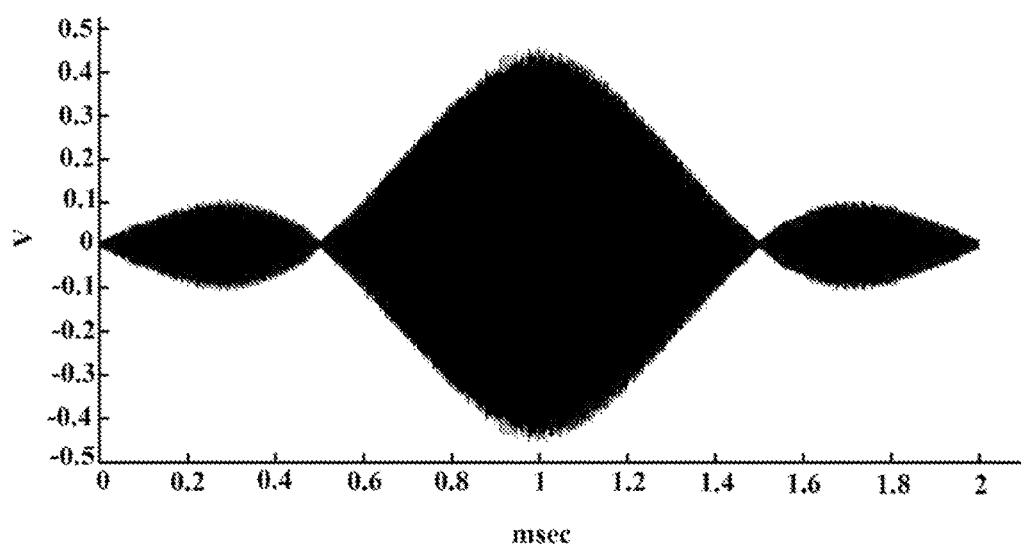
FIG. 21. Bandpass filtered output of IQ modulator with DSM based Weaver SSB of the present invention.
Figure 22:
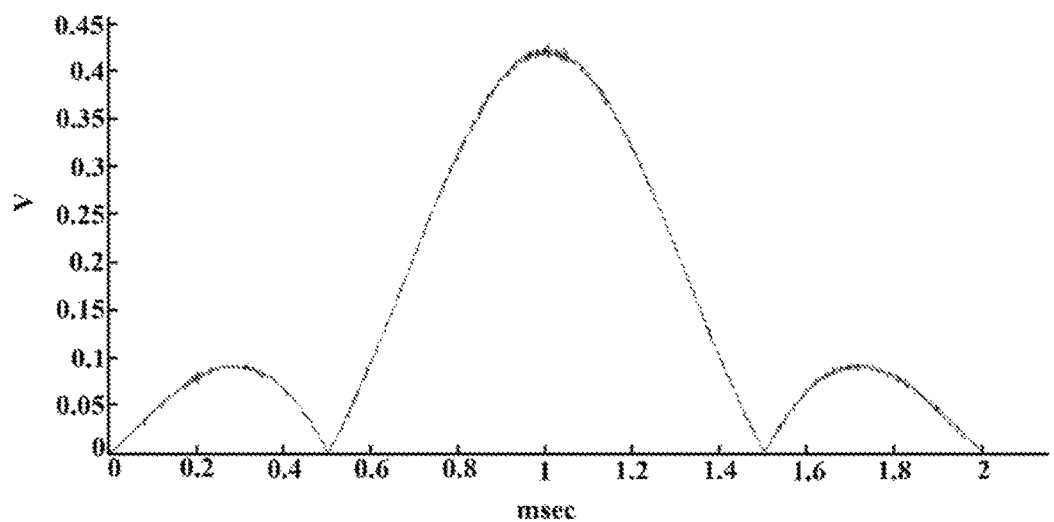
FIG. 22. Output amplitude information of digital IQ modulator with DSM based Weaver SSB at baseband of the present invention.
Figure 23:
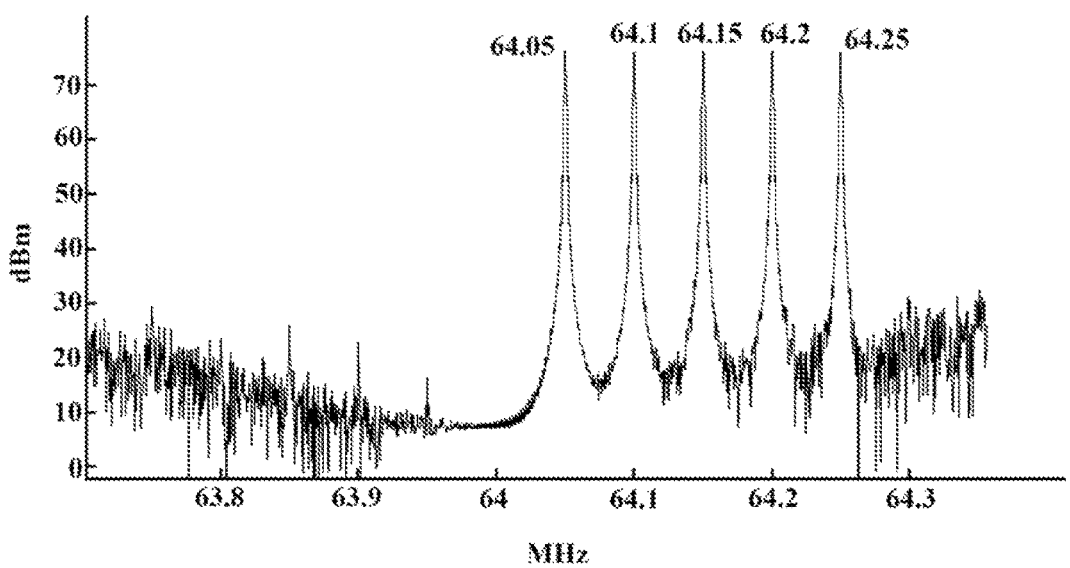
FIG. 23. Measured output spectrum of digital IQ modulator of the present invention, programmed to generate 5 frequency carriers (five independent tones, output power of each tone is attenuated for measurement purposes).

FIG. 18 and FIG. 19 show an example of input amplitude and phase signals, respectively. The frequency spectrum of the MRI signal at the modulator output is given in FIG. 20 for the MRI frequency of 64.25 MHz. The bandpass filtered output is shown in FIG. 21. The demodulated (baseband) amplitude signal of the digitally modulated output signal is calculated and plotted on FIG. 22. It is seen that the amplitude signal at the all-digital IQ modulator output are in good agreement with the input amplitude signal.

Figure 24:
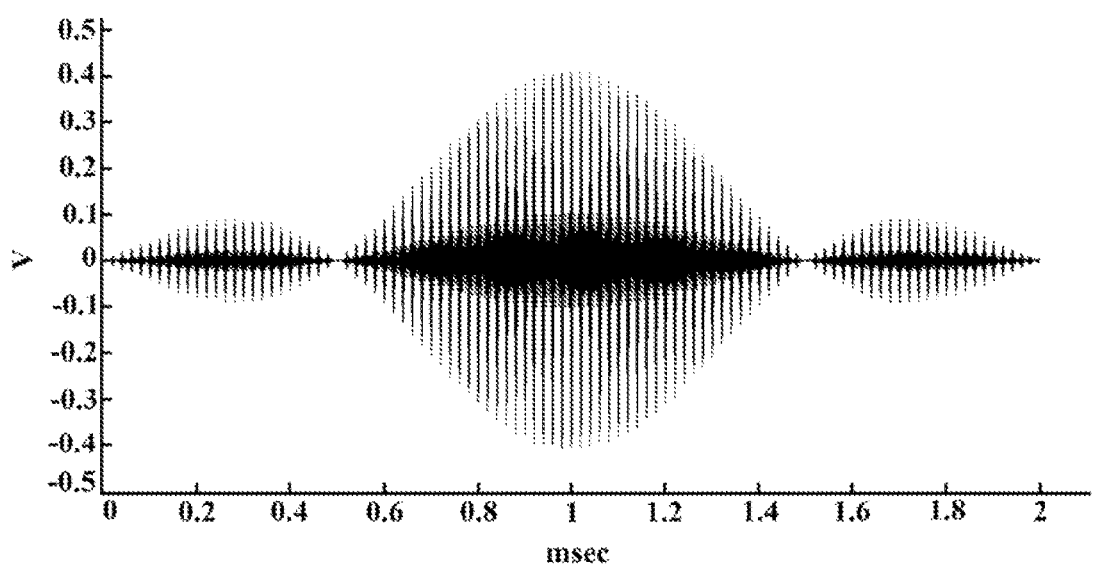
FIG. 24. Bandpass filtered output of all-digital modulator with DSM based Weaver SSB with multi-band carrier of the present invention.

As an example to multi-band signal generation, five signals all at different frequencies are synthesized in baseband as explained before. The synthesized signal is then modulated to 64 MHz and spans 200 kHz band in between 64.05 and 64.25 MHz. The multiband signal in digital is given in FIG. 24. Bandpass filtered output with 5-frequency carriers with the inter-carrier frequency spaing of 50 kHz is shown in FIG. 25.

The invention claimed is:

1. An all-digital RF transmitter, where signal modulations and amplifications are employed all digitally up to the transmitter's antenna, for Medical Imaging Devices, the all-digital RF transmitter comprising:
    an analog to digital converter blog, converting an analog input signal into a digital MRI signal utilizing a Delta Sigma Modulation (DSM);
    a DSM based Weaver SSB Modulator, performing the following steps
        multiplying the digital MRI signal with a sine signal having a desired MRI carrier frequency $f_{1n}$ to obtain a multiplied MRI signal, where $f_2-f_{1n}$=deltaf$_n$, deltaf$_n$ is a frequency difference between the desired MRI carrier frequency and a digital MRI signal frequency, and $f_2$ is an arbitrary constant,
        splitting the multiplied digital MRI signal into two signals,
        multiplying the two signals with in-phase and quadrature sine signals at $f_2$ and multiplying with 90° phase difference,
        filtering the two signals by a low pass FIR filter to remove an upper frequency of the two signals with equal power,
        modulating outputs of the low pass FIR filter by a DSM functional block,
        passing outputs of the DSM functional block through an xnor operation with in-phase and quadrature clock at the digital MRI signal frequency,
        summing up outputs of the xnor operation by a MUX block in order to remove a lower side band signal and create a single side band modulated digital MRI signal.

2. The all-digital RF transmitter as in claim 1, wherein the analog to digital converter blog is an I/Q modulator blog.

3. An all-digital RF transmitter method, where signal modulations and amplifications are employed all digitally up to the transmitter's antenna, for Medical Imaging Devices, the method comprising:
    converting an analog input signal into a digital MRI signal utilizing a Delta Sigma Modulation;
    multiplying the digital MRI signal with a sine signal having a desired MRI carrier frequency $f_{1n}$ to obtain a multiplied MRI signal, where $f_2-f_{1n}$=deltaf$_n$, deltaf$_n$ is a frequency difference between the desired MRI carrier frequency and a digital MRI signal frequency, and $f_2$ is an arbitrary constant;
    splitting the multiplied digital MRI signal into two signals;
    multiplying the two signals with in-phase and quadrature sine signals at $f_2$ and multiplying with 90° phase difference,
    filtering the two signals by a low pass FIR filter to remove an upper frequency of the two signals,
    modulating outputs of the low pass FIR filter by a DSM functional block,
    passing outputs of the DSM functional block through an xnor operation with in-phase and quadrature clock at the digital MRI signal frequency,
    summing up outputs of the xnor operation by a MUX block in order to remove a lower side band signal and create a single side band modulated digital MRI signal.

4. The all-digital RE transmitter method as in claim 3, wherein the step of converting an analog input signal into a digital MRI signal using a Delta Sigma Modulation further includes decomposing I and Q components of the analog signal.

* * * * *